(12) United States Patent
Zhang

(10) Patent No.: US 8,335,075 B2
(45) Date of Patent: Dec. 18, 2012

(54) CABLE ARRANGING MODULE

(75) Inventor: Yang Zhang, Shanghai (CN)

(73) Assignee: Inventec Corporation, Taipei (TW)

( * ) Notice: Subject to any disclaimer, the term of this patent is extended or adjusted under 35 U.S.C. 154(b) by 231 days.

(21) Appl. No.: 12/978,372

(22) Filed: Dec. 23, 2010

(65) Prior Publication Data

US 2012/0134094 A1   May 31, 2012

(30) Foreign Application Priority Data

Nov. 30, 2010   (TW) ................................ 99141541 A

(51) Int. Cl.
*H05K 5/00* (2006.01)
*H05K 7/16* (2006.01)
*H05K 7/14* (2006.01)
*H01R 4/00* (2006.01)
*H01R 13/46* (2006.01)

(52) U.S. Cl. ......... 361/679.33; 361/679.37; 361/679.39; 361/679.4; 361/724; 361/725; 361/726; 174/365; 174/542; 174/559; 174/59; 174/60

(58) Field of Classification Search .. 361/679.31–679.4, 361/679.55–679.6, 724–727; 174/363–387, 174/542, 559–563, 59–64, 138 B, 138 D, 174/170; 369/75.11, 75.21, 76, 77.11, 77.21, 369/78, 79, 80, 81, 82
See application file for complete search history.

(56) References Cited

U.S. PATENT DOCUMENTS

| 2003/0042824 | A1* | 3/2003 | Coffin et al. | 312/223.2 |
| 2008/0164795 | A1* | 7/2008 | Peng et al. | 312/334.5 |

* cited by examiner

*Primary Examiner* — Jayprakash N Gandhi
*Assistant Examiner* — Jerry Wu
(74) *Attorney, Agent, or Firm* — Jianq Chyun IP Office

(57) ABSTRACT

A cable arranging module suitable for an electronic device is provided. The electronic device includes a chassis and an electronic module disposed pluggably to the chassis. The cable arranging module includes a cable set, a fixed frame and a chain structure. The cable set is connected to the electronic module. The fixed frame is fixed in the chassis. The chain structure is connected between the fixed frame and the electronic module. The fixed frame and the chain structure form a chamber for containing the cable set. When the electronic module is located in the chassis, the chain structure is bended and contained in the chassis. When the electronic module is pulled out from the chassis, the chain structure drives the cable set to be curved and move. When the electronic module is pulled out entirely, the chain structure is extended and at least partially located out of the chassis.

10 Claims, 8 Drawing Sheets

CABLE ARRANGING MODULE

CROSS-REFERENCE TO RELATED APPLICATION

This application claims the priority benefit of Taiwan application serial no. 99141541, filed on Nov. 30, 2010. The entirety of the above-mentioned patent application is hereby incorporated by reference herein and made a part of this specification.

BACKGROUND

1. Field of the Invention

The invention relates to a cable arranging module. Particularly, the invention relates to a cable arranging module including a chain structure.

2. Description of Related Art

A server is a core computer in a network system used for serving various computers, which can provide functions such as storage and print service for network users, and provide clients to share various resources within the network environment. A basic structure of the server is approximately the same to a general personal computer, which is composed of a central processing unit (CPU), a memory and an input/output (I/O) device, etc., and the devices are connected through a bus. A north bridge chip is used to connect the CPU and the memory, and the I/O device is connected through a south bridge chip. A chassis structure of the server has three evolution stages from earlier tower chassis to rack mount chassis stressing centrality, and then blade servers of high-density calculation.

Taking a rack mount server as an example, the rack mount server is a server with an appearance designed according to uniform standards, which is used in collaboration with a cabinet. The rack mount server can be regarded as a tower server with an optimized structure, and a design principle thereof is to reduce a space occupation of the server as far as possible. Many professional network devices apply the rack mount structure, and have a flat shape as that of a drawer, for example, switches, routers and hardware firewalls, etc. A width of the rack mount server is 19 inches, and a height thereof applies a unit of U (1U=1.75 inches=44.45 mm), and the servers are generally complied with standards of 1U, 2U, 3U, 4U, 5U or 7U.

The size of the cabinet also is also complied with a common industrial standard, which is generally between 22U and 42U. The cabinet includes a detachable sliding rack according to the height thereof, and the user can flexibly adjust the height according to a height of the server, so as to store network devices such as a server, a hub, a disk array, etc. After the server is settled, the I/O lines thereof are all led out from the rear of the cabinet (all interfaces of the rack mount server are also located at the rear of the cabinet), and are uniformly disposed in a cable slot of the cabinet, and are attached with labels to facilitate management.

Regarding a server having a pluggable hard disk module, when the hard disk module is moved relative to a chassis, cables connected to the hard disk module are also moved or curved. If the cables are not suitably fixed and are irregularly moved and curved, the cables can fall off from the hard disk module. Therefore, it is an important issue to maintain bending degrees of freedom of the cables while preventing the cables from falling off.

SUMMARY OF THE INVENTION

The invention is directed to a cable arranging module, which can prevent a cable set from falling off.

The invention provides a cable arranging module suitable for an electronic device. The electronic device includes a chassis and an electronic module. The electronic module is disposed pluggably in the chassis. The cable arranging module includes a cable set, a fixed frame and a chain structure. The cable set is connected to the electronic module. The fixed frame is fixed in the chassis. The chain structure is formed by a plurality of pivoted elements pivoted in sequence. A first end of the chain structure is connected to the fixed frame, and a second end of the chain structure is connected to the electronic module. The fixed frame and the chain structure commonly form a chamber. The cable set is located in the chamber. When the electronic module is located in the chassis, the chain structure is bended and contained in the chassis. When the electronic module is pulled out from the chassis, the chain structure drives the cable set to be curved and move. When the electronic module is pulled out from the chassis entirely, the chain structure is extended and at least partially located out of the chassis.

In an embodiment of the invention, the electronic device is a server, and the electronic module is a hard disk module.

In an embodiment of the invention, the electronic device further includes a motherboard module, the motherboard module is disposed in the chassis, and the cable arranging module is located between the motherboard module and the hard disk module.

In an embodiment of the invention, the hard disk module has a backplane and the backplane has a plurality of connectors. The cable set includes a plurality of cables, and the cables are respectively connected to the connectors. A first segment of each of the cables is fixed to the fixed frame, and a second segment of each of the cables is fixed to the chain structure.

In an embodiment of the invention, each of the pivoted elements includes at least a first position-limiting arm, and each of the second segments is confined on the pivoted elements by the first position-limiting arms.

In an embodiment of the invention, the fixed frame includes a main body and a plurality of second position-limiting arms. The second position-limiting arms extend out from the main body, where each of the first segments is confined on the main body by the second position-limiting arms.

In an embodiment of the invention, the electronic device has a switch board located in the chassis. One end of the cable set is connected to the switch board through an opening of the fixed frame, and another end of the cable set is connected to the backplane through an opening of the chain structure.

In an embodiment of the invention, the cable arranging module further includes a connection rod. One end of the connection rod is pivotally connected to the electronic module, and another end of the connection rod is pivotally connected to the second end of the chain structure.

In an embodiment of the invention, the cable set includes a power line and a plurality of data transmission lines.

In an embodiment of the invention, each of the pivoted elements has a pivoted portion and a pivoted hole located on the pivoted portion. The pivoted portion of each of the pivoted elements is overlapped with the pivoted portion of the other pivoted element, so that the pivoted hole of each of the pivoted elements is aligned to the pivoted hole of the other pivoted element.

In an embodiment of the invention, the chassis has a slide rail. The electronic module is slidingly disposed on the slide rail. The fixed frame is extended along a first axial line, and the first axial line is parallel to an extending direction of the slide rail and located under the slide rail. When the electronic module is located in the chassis, a part of the chain structure is carried by the slide rail, and is located on a second axial line parallel to the first axial line. When the electronic module is slid out from the chassis along the slide rail, the chain structure carried by the slide rail departs from the slide rail along the second axial line, and is partially moved to the first axial line, and a part of the cable set is curved along with the chain structure.

According to the above descriptions, the cable arranging module of the invention is formed by the fixed frame and the chain structure, and the cable set is fixed to the fixed frame and the chain structure. When the electronic module is moved relative to the chassis, a part of the cable set can be curved along with the chain structure, so that a whole structure thereof may have enough degrees of freedom. One end of the chain structure is connected to the electronic module to maintain a relative position between a tail end of the cable set and the electronic module, so as to prevent the cable set from falling off from the electronic module due to movement of the electronic module.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
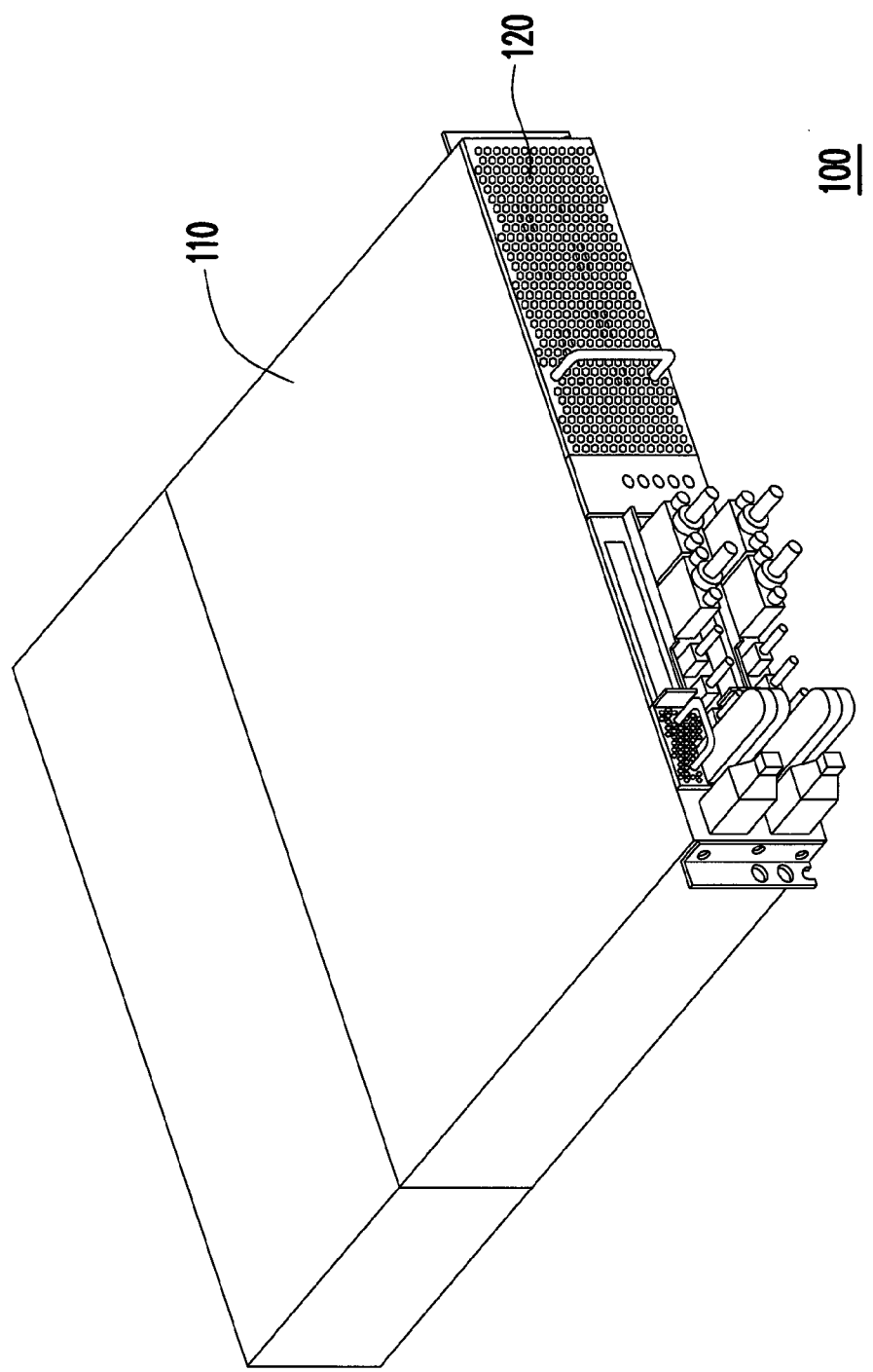
FIG. 1 is a three-dimensional view of an electronic device according to an embodiment of the invention.
Figure 2:
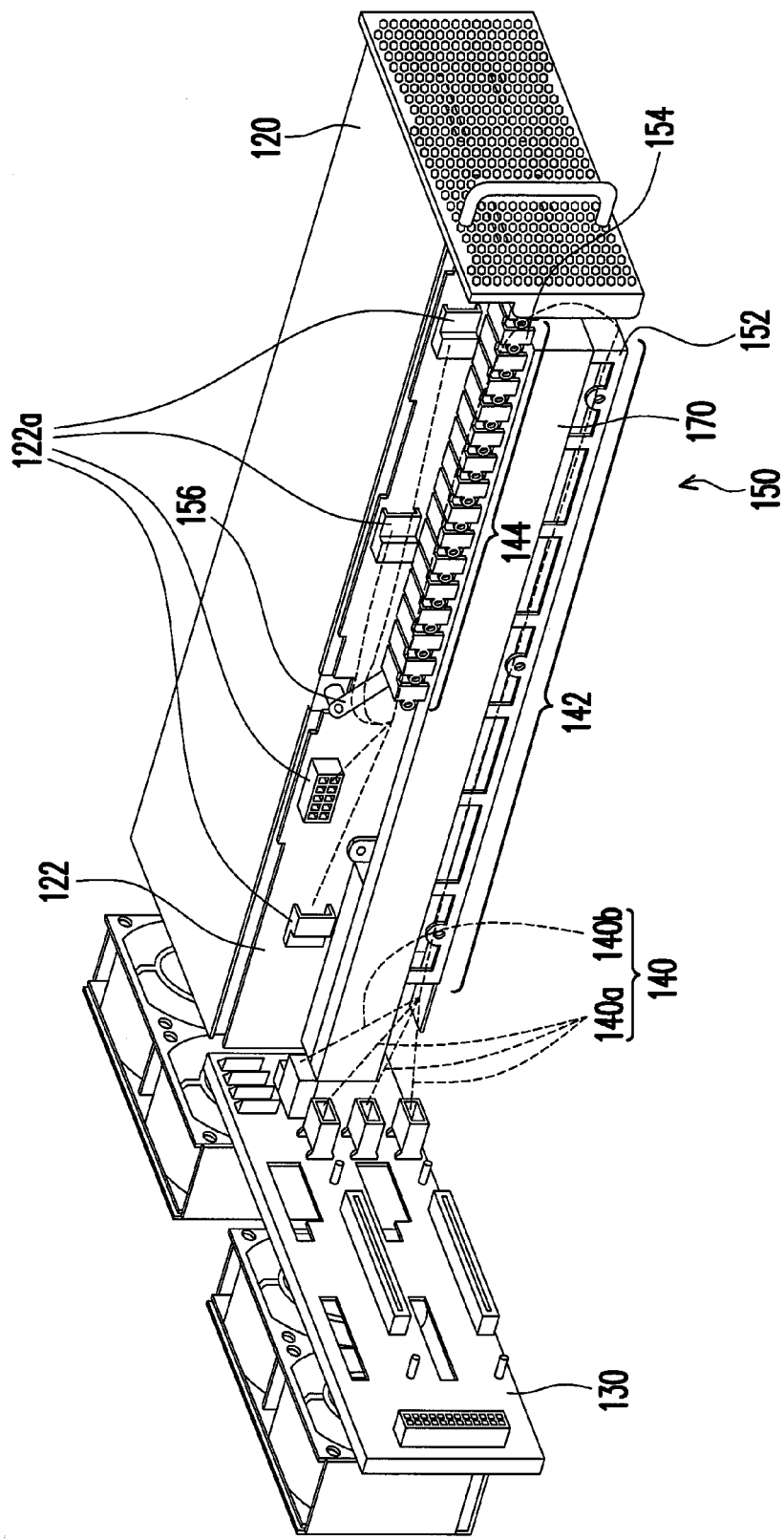
FIG. 2 is a three-dimensional view of a part of components of the electronic device of FIG. 1.

FIG. 1 is a three-dimensional view of an electronic device according to an embodiment of the invention. FIG. 2 is a three-dimensional view of a part of components of the electronic device of FIG. 1. For clarity's sake, a cable module 140 of FIG. 2 is shown in dot lines. Referring to FIG. 1 and FIG. 2, the electronic device 100 of the present embodiment includes a chassis 110, an electronic module 120, a switch board 130 and a cable arranging module 150. The electronic module 120 is disposed in the chassis 110, and is suitable for being pulled out from the chassis 110. The switch board 130 is disposed in the chassis 110. The cable arranging module 150 includes the cable set 140, a fixed frame 152 and a chain structure 154. The fixed frame 152 is fixed in the chassis 110. Two ends of the chain structure 154 are respectively connected to the fixed structure 152 and the electronic module 120. The fixed frame 152 and the chain structure 154 commonly form a chamber. The cable set 140 is located in the chamber and has a first segment 142 and a second segment 144. The first segment 142 is fixed to the fixed structure 152, and the second segment 144 is fixed to the chain structure 154. The first segment 142 is connected to the switch board 130 through an opening of the fixed frame 152, and the second segment 144 is connected to the electronic module 120 through an opening of the chain structure 154. In the present embodiment, the electronic device 100 is, for example, a server, and the electronic module 120 is, for example, a pluggable hard disk module. When the electronic module 120 is located in the chassis 110 as that shown in FIG. 2, the chain structure 154 is bended and contained in the chassis 110.

Figure 3:
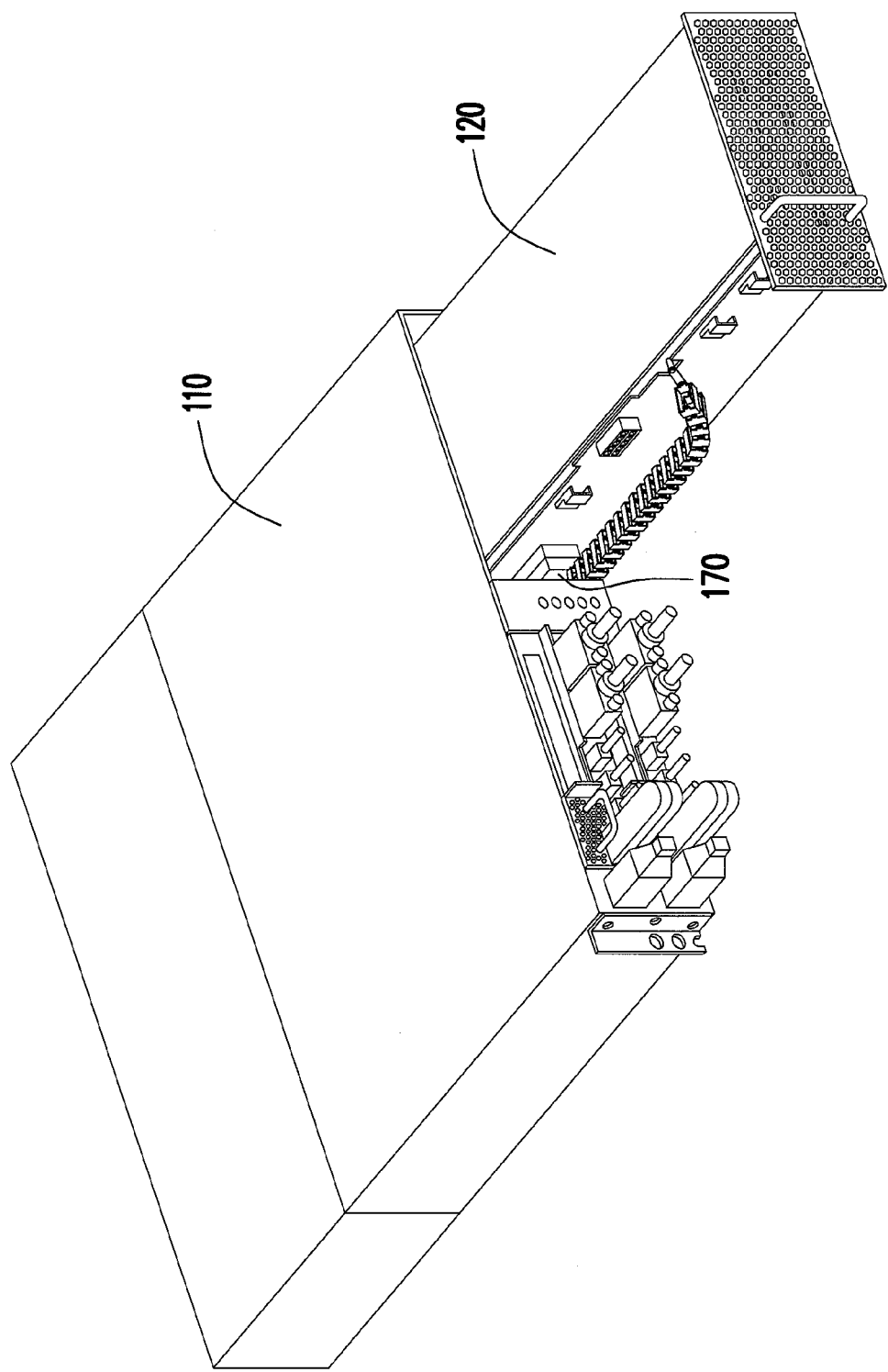
FIG. 3 is a three-dimensional view of the electronic device of FIG. 1 in case that an electronic module is pulled out from a chassis.
Figure 4:
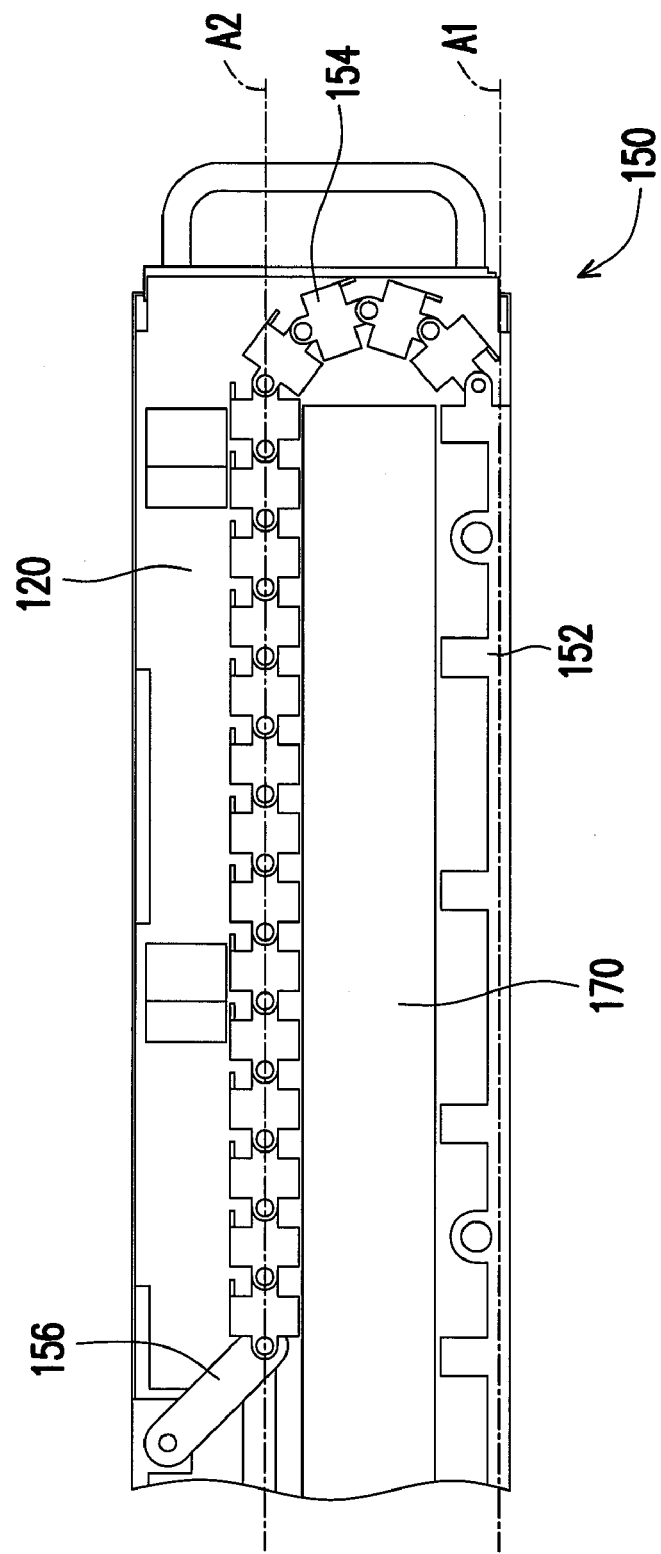
FIG. 4 is a partial side view of a cable arranging module of FIG. 1.
Figure 5:
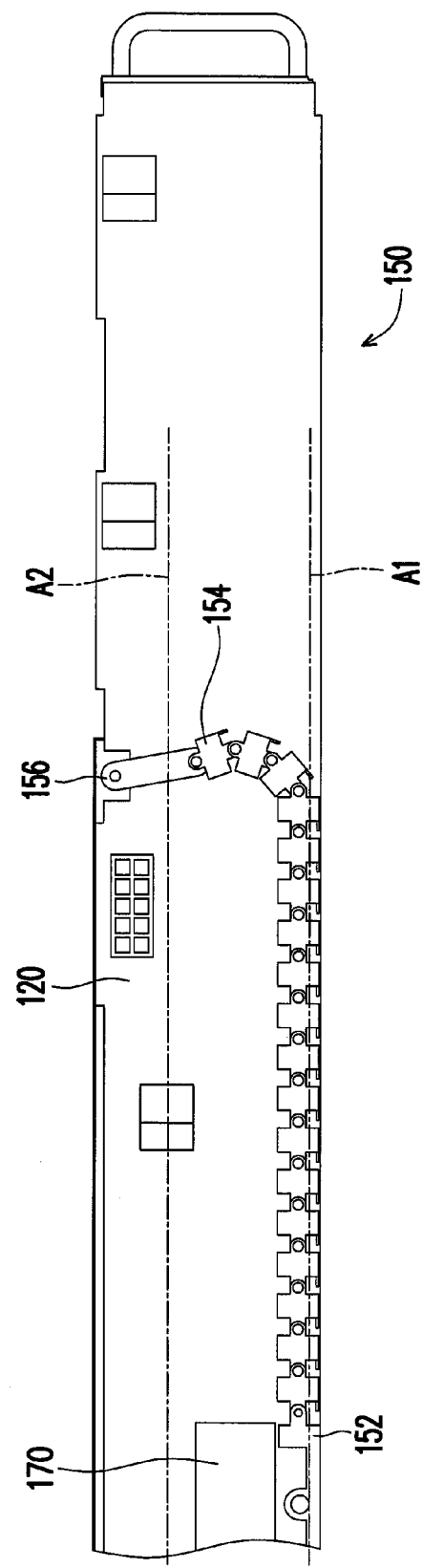
FIG. 5 is a partial side view of a cable arranging module of FIG. 3.

FIG. 3 is a three-dimensional view of the electronic device of FIG. 1 in case that the electronic module is pulled out from the chassis. FIG. 4 is a partial side view of the cable arranging module of FIG. 1. FIG. 5 is a partial side view of the cable arranging module of FIG. 3. When the electronic module 120 is pulled out from the chassis 110 (shown in FIG. 3 and FIG. 5), or the electronic module 120 is pushed in the chassis 110 (shown in FIG. 1 and FIG. 4), one end of the chain structure 154 connected to the electronic module 120 is driven to be moved relative to the chassis 110. During such process, the second segment 144 (shown in FIG. 2) is curved along with the chain structure 154, so that a whole structure thereof may have enough degrees of freedom. Since one end of the chain structure 154 is connected to the electronic module 120, a relative position between a tail end of the cable set 140 (shown in FIG. 2) and the electronic module 120 can be maintained, so as to prevent the cable set 140 from falling off from the electronic module 120 due to movement of the electronic module 120. When the electronic module 120 is entirely pulled out from the chassis 110 as that shown in FIG. 3 and FIG. 5, the chain structure 154 is extended and at least partially located out of the chassis 110.

In detail, the chassis 110 has a slide rail 170. The electronic module 120 is slidingly disposed on the slide rail 170. The fixed frame 152 is extended along a first axial line A1 (shown in FIG. 4 and FIG. 5), and the first axial line A1 is parallel to an extending direction of the slide rail 170 and located under the slide rail 170. When the electronic module 120 is located in the chassis 110, a part of the chain structure 170 is carried by the slide rail 170, and is located on a second axial line A2 (shown in FIG. 4) parallel to the first axial line A1. When the electronic module 120 is slid out from the chassis 110 along the slide rail 170, the chain structure 154 carried by the slide rail 170 departs from the slide rail 170 along the second axial line A2, and is partially moved to the first axial line A1 (shown in FIG. 5), and a part of the cable set 140 is curved along with the chain structure 154.

Referring to FIG. 2, in detail, the cable set 140 of the present embodiment is formed by a plurality of cables, and the cables include a plurality of data transmission lines 140a and a power line 140b. The electronic module 120 has a backplane 122. The backplane 122 has a plurality of connectors 122a, and the connectors 122a are connected to the cable set 140 to facilitate data and power transmission. The data transmission lines 140a and the power line 140b are fixed to the chain structure 154 and are extended out from a tail end of the chain structure 154 to connect the backplane 122. The tail end of the chain structure 154 is fixed to the electronic module 120, so that a relative position between the electronic module 120 and a segment of the data transmission lines 140a and the power line 140b at the tail end can be maintained, so as to reduce a chance that the data transmission lines 140a and the power line 140b fall off from the electronic module 120 can be reduced.

Figure 6:
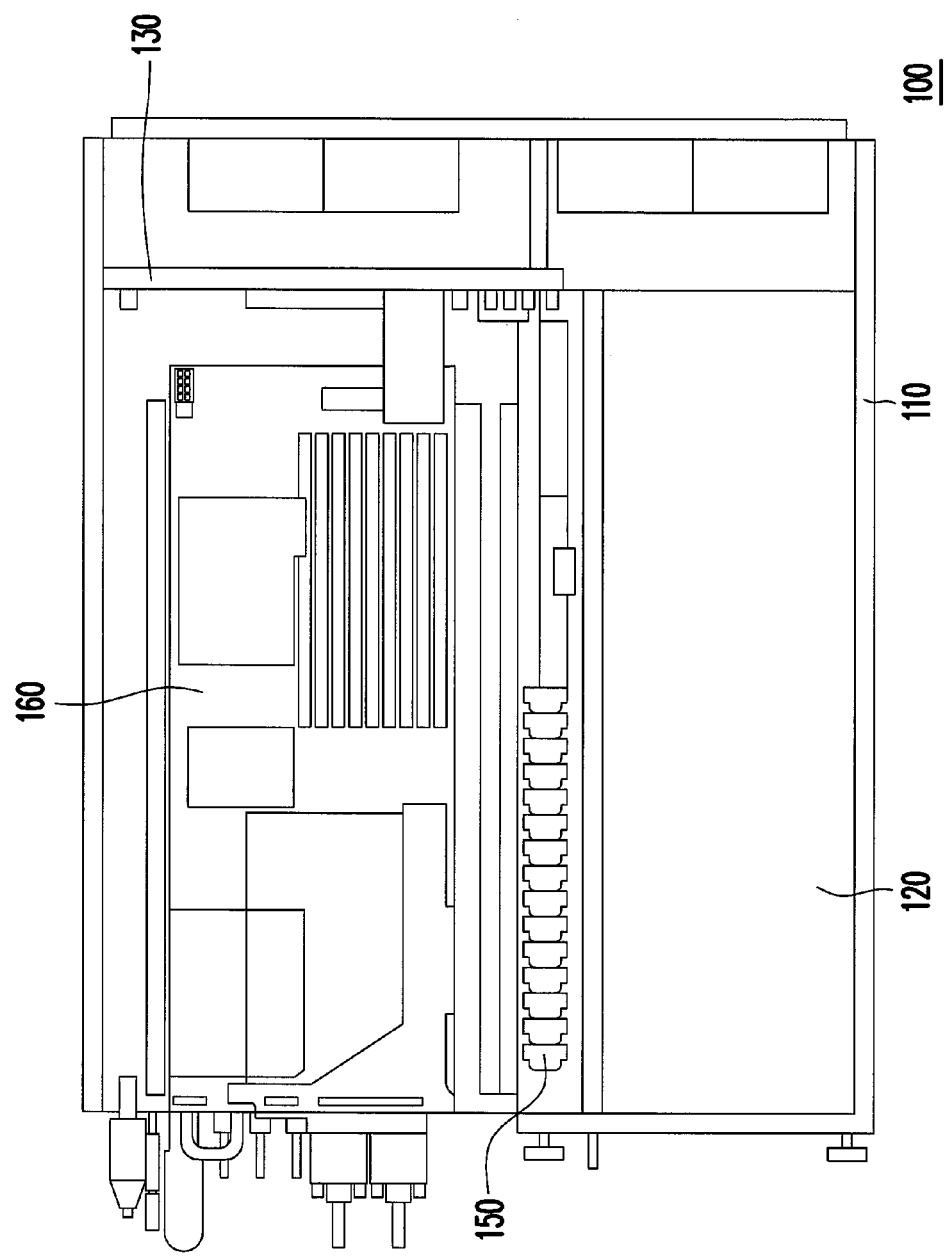
FIG. 6 is a top view of the electronic device of FIG. 1.

FIG. 6 is a top view of the electronic device of FIG. 1. For clarity's sake, a top surface of the chassis 110 is not illustrated in FIG. 6. Referring to FIG. 6, the electronic device 100 of the present embodiment further includes a motherboard module 160. The motherboard module 160 is disposed in the chassis 110, and the cable arranging module 150 is located between the motherboard module 160 and the electronic module 120. Based on such a high-density configuration method, the electronic device 100 may have a relatively small size to save a configuration space.

Figure 7:
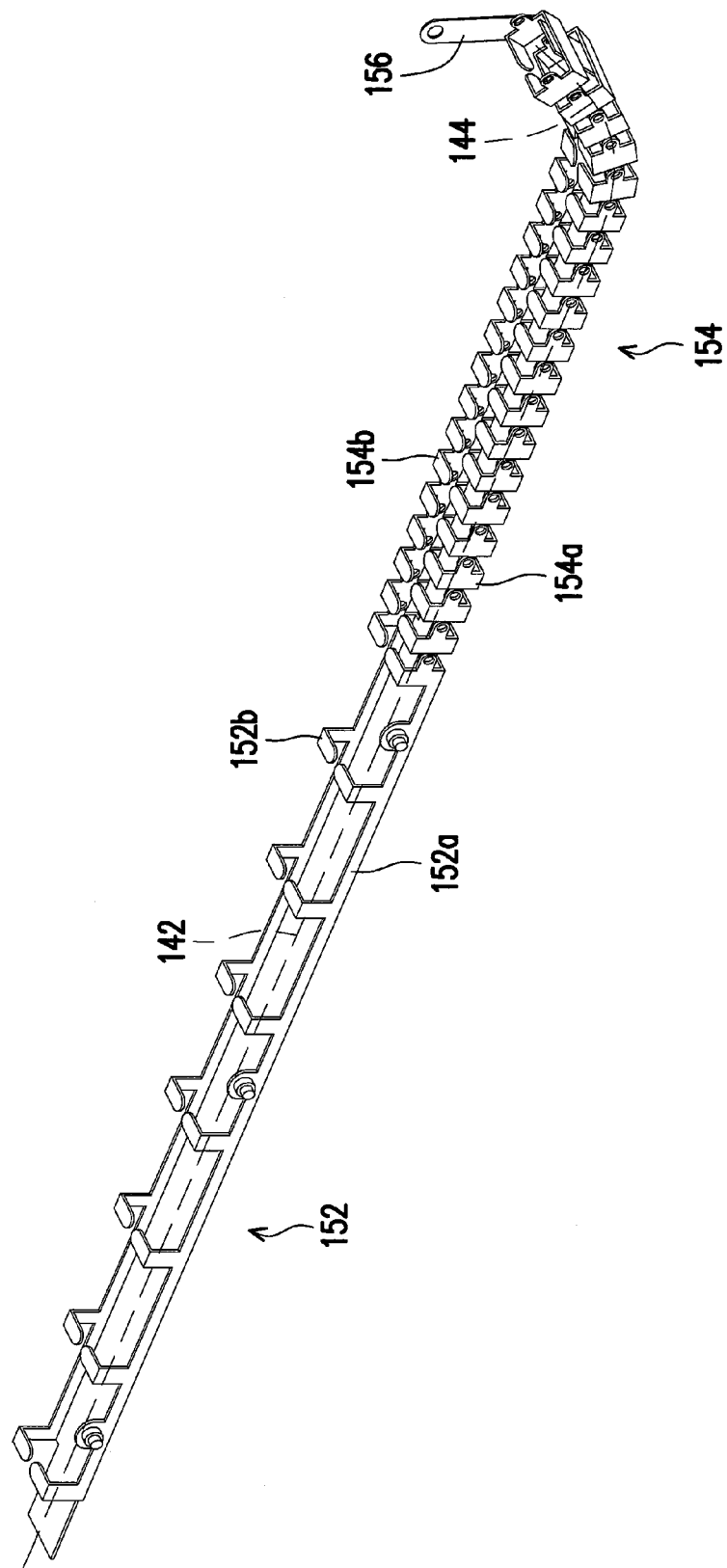
FIG. 7 is a three-dimensional view of a fixed frame and a chain structure of FIG. 5.
Figure 8:
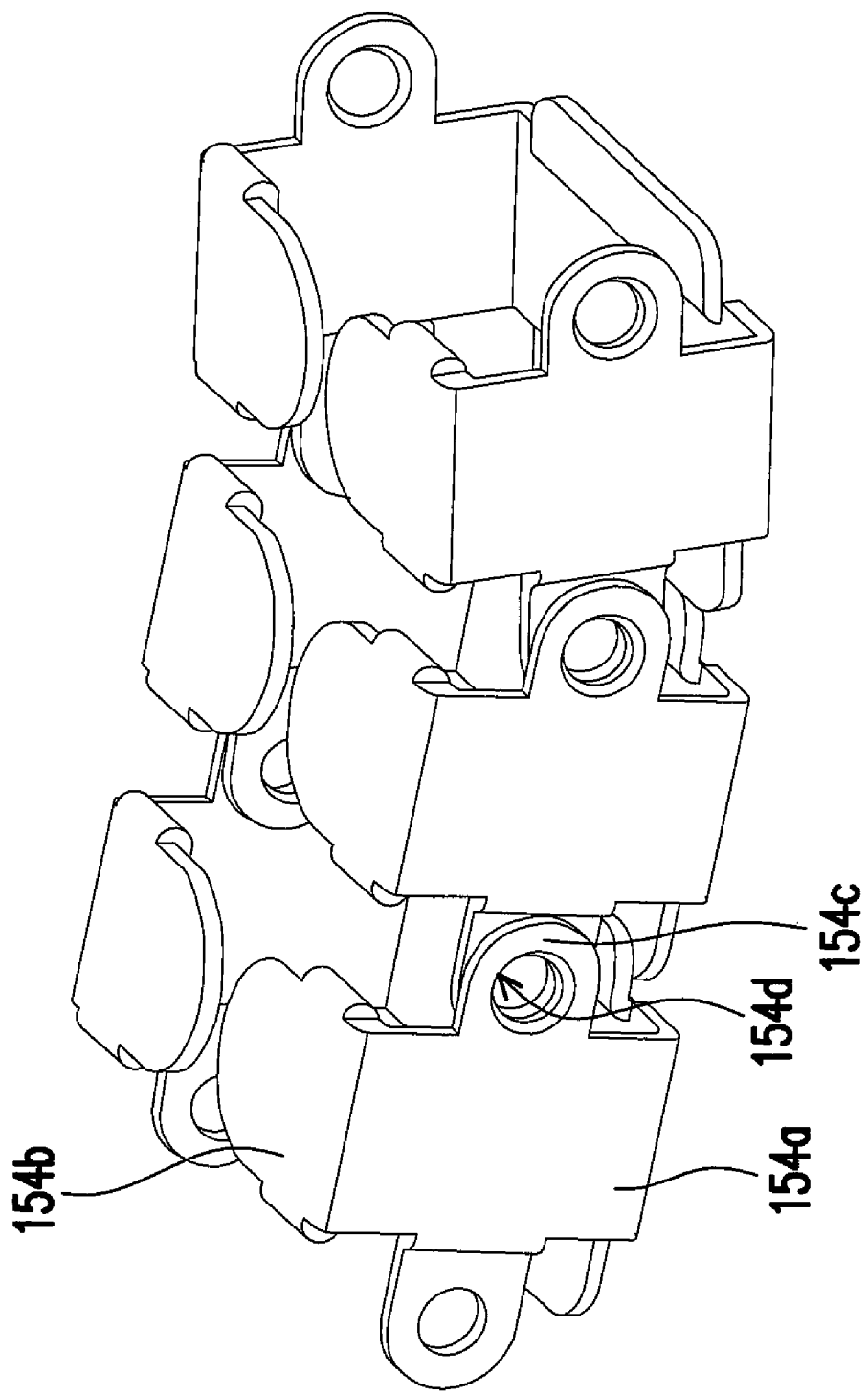
FIG. 8 is a partial three-dimensional view of the chain structure of FIG. 7.

FIG. 7 is a three-dimensional view of the fixed frame and the chain structure of FIG. 5, and FIG. 8 is a partial three-dimensional view of the chain structure of FIG. 7. Referring to FIG. 7, in the present embodiment, the fixed frame 152 includes a main body 152a and a plurality of position-limiting arms 152b. The position-limiting arms 152b extend out from the main body 152a. Each of the first segments 142 (shown in dot lines) is confined on the main body 152a by the position-limiting arms 152b, so as to fix the cable set 140 (shown in FIG. 2). Moreover, referring to FIG. 7 and FIG. 8, the chain structure 154 includes a plurality of pivoted elements 154a. The pivoted elements 154a are sequentially pivoted to form the chain structure 154, so as to facilitate bending. Each of the pivoted elements 154a has at least a position-limiting arm 154b, and each of the second segments 144 (shown in dot lines) is confined on the pivoted elements 154a by the first position-limiting arms 154b, so as to fix the cable set 140 (shown in FIG. 2). Moreover, each of the pivoted elements 154a has a pivoted portion 154c and a pivoted hole 154d located on the pivoted portion 154c. The pivoted portion 154c of each of the pivoted elements 154a is overlapped with the pivoted portion 154c of the other pivoted element 154a, so that the pivoted hole 154d of each of the pivoted elements 154a is aligned to the pivoted hole 154d of the other pivoted element 154a, and therefore the two adjacent pivoted elements 154a can be pivotally connected through the pivoted holes 154d.

Referring to FIG. 4 and FIG. 5, in the present embodiment, the cable arranging module 150 further includes a connection rode 156. One end of the connection rod 156 is pivotally connected to the electronic module 120, and another end of the connection rod 156 is pivotally connected to the chain structure 154. An angle between the connection rode 156 and the chain structure 154 can be suitably designed, so that a user can easily operate the whole structure between states as that shown in FIG. 4 and FIG. 5.

In summary, the cable arranging module of the invention is formed by the fixed frame and the chain structure, and the cable set is fixed to the fixed frame and the chain structure. When the electronic module is moved relative to the chassis, a part of the cable set can be curved along with the chain structure, so that a whole structure thereof may have enough degrees of freedom. One end of the chain structure is connected to the electronic module to maintain a relative position between the tail end of the cable set and the electronic module, so as to prevent the cable set from falling off from the electronic module due to movement of the electronic module.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A cable arranging module, adapted to an electronic device, the electronic device comprising a chassis and an electronic module, the electronic module being disposed pluggably in the chassis, and the cable arranging module comprising:
   a cable set, connected to the electronic module; a fixed frame, fixed in the chassis; and
   a chain structure, formed by a plurality of pivoted elements pivoted in sequence, wherein a first end of the chain structure is connected to the fixed frame, and a second end of the chain structure is connected to the electronic module, the fixed frame and the chain structure commonly form a chamber, and the cable set is located in the chamber, wherein when the electronic module is located in the chassis, the chain structure is bended and contained in the chassis, when the electronic module is pulled out from the chassis, the chain structure drives the cable set to be curved and move, and when the electronic module is pulled out from the chassis entirely, the chain structure is extended and at least partially located out of the chassis; and
   each of the pivoted elements has a first side and an opposite second side and each side comprises a pivoted portion and a pivoted hole located on the pivoted portion, one of the pivoted portion on the first side or the opposite second side is depressed toward the chamber so that one side of the pivoted portion of each of the pivoted elements is overlapped with the other side of the pivoted portion of the other pivoted element, wherein the pivot hole of each of the pivoted elements is aligned to the adjacent pivoted hole of the other pivoted element.

2. The cable arranging module as claimed in claim 1, wherein the electronic device is a server, and the electronic module is a hard disk module.

3. The cable arranging module as claimed in claim 2, wherein the electronic device further comprises a motherboard module disposed in the chassis, and the cable arranging module is located between the motherboard module and the hard disk module.

4. The cable arranging module as claimed in claim 2, wherein the hard disk module has a backplane and the backplane has a plurality of connectors, the cable set comprises a plurality of cables, and the cables are respectively connected to the connectors, a first segment of each of the cables is fixed to the fixed frame, and a second segment of each of the cables is fixed to the chain structure.

5. The cable arranging module as claimed in claim 4, wherein each of the pivoted elements comprises at least a first position-limiting arm, and each of the second segments is confined on the pivoted elements by the first position-limiting arms.

6. The cable arranging module as claimed in claim 4, wherein the fixed frame comprises:
   a main body; and
   a plurality of second position-limiting arms, extending out from the main body, wherein each of the first segments is confined on the main body by the second position-limiting arms.

7. The cable arranging module as claimed in claim 4, wherein the electronic device has a switch board located in the chassis, one end of the cable set is connected to the switch board through an opening of the fixed frame, and another end of the cable set is connected to the backplane through an opening of the chain structure.

8. The cable arranging module as claimed in claim 1, further comprising a connection rod, wherein one end of the connection rod is pivotally connected to the electronic module, and another end of the connection rod is pivotally connected to the second end of the chain structure.

9. The cable arranging module as claimed in claim 1, wherein the cable set comprises a power line and a plurality of data transmission lines.

10. The cable arranging module as claimed in claim 1, wherein the chassis has a slide rail, the electronic module is slidingly disposed on the slide rail, the fixed frame is extended along a first axial line, and the first axial line is parallel to an extending direction of the slide rail and located under the slide rail, when the electronic module is located in the chassis, a part of the chain structure is carried by the slide rail, and is located on a second axial line parallel to the first axial line, when the electronic module is slid out from the chassis along the slide rail, the chain structure carried by the slide rail departs from the slide rail along the second axial line and is partially moved to the first axial line, and a part of the cable set is curved along with the chain structure.

* * * * *